United States Patent [19]

Bools

[11] Patent Number: 4,463,267
[45] Date of Patent: Jul. 31, 1984

[54] POWER SUPPLY MONITOR

[75] Inventor: William G. Bools, Blue Ash, Ohio

[73] Assignee: General Electric Company, Cincinnati, Ohio

[21] Appl. No.: 394,755

[22] Filed: Jul. 2, 1982

[51] Int. Cl.³ ............................................. F02D 33/00
[52] U.S. Cl. ................................... 290/40 R; 290/51; 322/38; 123/198 DB
[58] Field of Search ................. 290/40 R, 40 A, 40 B, 290/40 C, 40 F, 51; 322/38; 361/86, 88; 123/198 DB; 371/71, 72

[56] References Cited

U.S. PATENT DOCUMENTS

| 2,839,694 | 6/1958 | Fairweather et al. | 322/38 X |
| 3,385,278 | 5/1968 | Johnson, Jr. et al. | 123/198 |
| 3,611,039 | 10/1971 | Sakamoto | 322/38 X |
| 3,663,958 | 5/1972 | Crane | 324/133 |
| 3,810,251 | 5/1974 | Blanyer | 290/40 |
| 4,217,617 | 8/1980 | Rossi et al. | 290/40 A X |
| 4,283,634 | 8/1981 | Yannone et al. | 290/40 R |
| 4,402,288 | 9/1983 | Ohgami et al. | 290/51 X |

Primary Examiner—Gene Z. Rubinson
Assistant Examiner—W. E. Duncanson, Jr.
Attorney, Agent, or Firm—Gregory A. Welte; Derek P. Lawrence

[57] ABSTRACT

A power supply monitor is disclosed for monitoring the finely regulated voltage in a two-stage tracking power supply which is driven by a gas turbine engine and which has a coarsely regulated and a finely regulated stage. A reference voltage is generated using power taken from the coarsely regulated stage and the reference voltage is compared with a voltage derived from an output of the finely regulated stage. If an unacceptable difference between the compared voltages is detected, controls are activated which prevent acceleration of the engine. The monitor is activated only after the engine reaches a selected speed and testing circuitry is provided.

11 Claims, 2 Drawing Figures

POWER SUPPLY MONITOR

The invention herein described was made in the course of or under a contract or subcontract thereunder (or grant) with the Department of the Navy.

The present invention relates to a system for monitoring a voltage signal and, more particularly, to a sysstem which monitors a voltage signal produced by a regulated stage in a gas-turbine-driven tracking power supply.

BACKGROUND OF THE INVENTION

A gas turbine engine commonly requires numerous sensors and servomechanisms to control its operation. Proper functioning of these sensors and servomechanisms requires a highly stable and precise electrical power supply. Typically, the power supply utilized is one designated as a tracking voltage regulator. The regulator receives electric power from a generator or alternator (the term generator is used herein as including both) which is mechanically driven by the engine itself. Such a regulator normally supplies two voltages of opposite polarity and equal magnitude. The regulator is designated as tracking because one of the voltages is constrained to follow, or track, the other in magnitude; however, the latter is generally independent of, and need not track, the former. Such a regulator frequently includes two stages, the first of which receives electrical power from the generator and regulates the voltage with a relatively coarse degree of accuracy. The second stage receives power from the first stage and regulates the voltage with a relatively finer degree of accuracy. The finely regulated voltage is used to energize the engine's sensors and servomechanisms.

In general, the finely regulated voltage stage of such power supplies can supply only a limited amount of current. If this stage should attempt to supply a greater current, as it may attempt to do when a short circuit occurs in a sensor or servomechanism which it energizes, the finely regulated voltage supplied will tend to drop in magnitude. This failure in voltage stability of the tracking supply has serious consequences to the sensors and servomechanisms. For example, during such a voltage drop, a sensor which measures engine speed may give an incorrectly low reading. A speed control servomechanism which relies on this sensor may attempt to accelerate the engine in response with the result that an engine overspeed condition may occur. Alternately, a servomechanism which controls an airflow pattern may attempt to change the pattern with the result that a condition of excessive temperature may occur.

Another problem can arise in the situation wherein the finely regulated voltage itself is used to energize a system which monitors that same voltage. In such a case, a drop in the regulated voltage can affect the circuitry of the monitoring system in such a way that the drop is, in effect, self-cancelling with the result that no drop is reported by the monitor. This can occur, for example, in a case where the monitor generates a reference voltage which is dependent upon the voltage monitored and then compares the two voltages to determine whether the monitored voltage is correct. A situation can occur in which a drop in the monitored voltage produces a corresponding drop in the reference voltage so that no change is detected in the difference between the two. In such a case, the power supply voltage drop would arise and persist undetected.

A further problem can occur in power supply monitors of this type during the startup cycle of the engine. During this cycle, the generator which produces the electricity which powers the power supply produces power at a relatively low voltage. Accordingly, the output voltage provided by the power supply will be relatively low. The power supply monitor can read this low voltage as indicative of a harmful condition when, in fact, it merely results from the operation of the engine in a startup mode.

OBJECTS OF THE INVENTION

It is an object of the present invention to provide a new and improved power supply monitor.

It is a further object of the present invention to provide a new and improved power supply monitor which does not depend for its own power upon the voltage of the stage of the power supply monitored.

It is a further object of the present invention to provide a new and improved power supply monitor which detects variations in the voltage of the power supply and takes corrective action with respect to the source of mechanical power driving a generator which supplies the power supply.

It is a further object of the present invention to provide a new and improved power supply monitor which is inactive during the startup mode of the source of mechanical power and becomes active when the source passes out of the startup mode.

SUMMARY OF THE INVENTION

One form of the present invention operates in conjunction with a two-stage power supply having a coarsely regulated stage and a finely regulated stage. The invention monitors the voltage provided at one output terminal of the finely regulated stage, yet receives its own operating power from the coarsely regulated stage. The output voltage signal is compared with a reference voltage signal and if the difference reaches a predetermined value, a fault signal is generated.

In a preferred embodiment, the two-stage power supply receives its power from an electrical generator which is mechanically driven by a gas turbine engine. The fault signal of the power supply monitor is fed to speed controlling equipment and this equipment is thereby prompted to take action to reduce the speed of the engine as, for example, by shutting off a flow of fuel.

The preferred embodiment further comprises a sensor which measures the speed of a rotating component in the engine and produces a signal indicative of that speed. The signal is fed to circuitry which either deactivates the monitor when the engine speed is below a predetermined limit or activates the monitor when the engine speed rises above the limit. This action deactivates the monitor during the startup cycle of the engine.

The preferred embodiment further comprises testing circuitry which allows an operator to introduce a signal into the monitor which has the effect of simulating a voltage drop in the finely regulated power supply such that the monitor issues a fault signal indicating that the power supply voltage has fallen below acceptable limits.

DETAILED DESCRIPTION OF THE INVENTION

Figure 1:
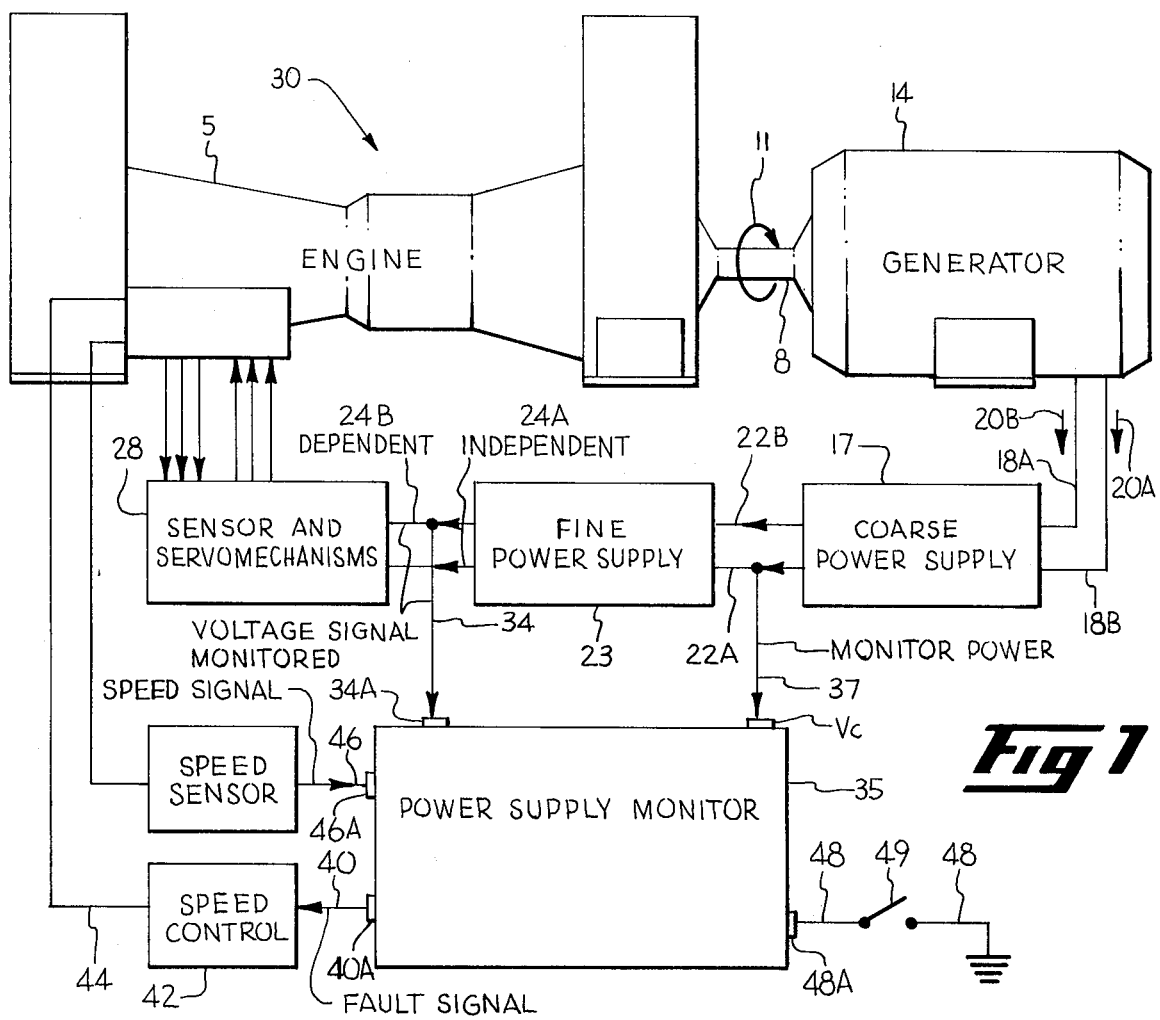
FIG. 1 depicts a schematic representation of one form of the present invention in conjunction with electrical generating equipment.

As FIG. 1 schematically indicates, an engine 5, which may be a gas turbine engine, supplies mechanical power to shaft 8 which rotates as indicated by arrow 11. Shaft 8 transmits the mechanical power to a generator 14 which provides electrical power to a coarsely regulated power supply 17 by means of electrical conduits 18A and 18B. Arrows 20A and 20B indicate the direction of flow of electrical power and similar arrows will be used elsewhere in FIG. 1 to indicate the general direction of power flow and signal flow. Coarsely regulated power supply 17 provides electrical power to conduits 22A and 22B at predetermined voltages, but within certain relatively coarse tolerances. For example, conduit 22A may provide power at a voltage of +21 volts plus or minus 1 volt. Similarly, the voltage at conduit 22B may be fixed at −21 volts plus or minus 1 volt.

Conduits 22A and 22B supply electrical power to a finely regulated power supply 23 which supplies electrical power to conduits 24A and 24B at voltages which are restricted to much finer tolerances. For example, conduit 24A may be held at +15 volts with a tolerance of 0.025 volt, while conduit 24B may be held to −15 volts and restricted to the same tolerance. The electrical power supplied to conduits 24A and 24B by the finely regulated power supply 23 is used for such purposes as energizing engine performance sensors and engine control servomechanisms generally indicated by block 28. Arrows, generally indicated as 30, extending between rectangle 28 and engine 5, indicate that information signals and servomechanism controlling functions travel in both directions between rectangle 28 and the engine 5.

Conduit 34 is coupled to an input 34A of the Power Supply Monitor of the present invention which is indicated as block 35. Conduit 37 is connected to another input $V_c$ of the power supply monitor 35. Conduit 40 is connected between an output 40A of the power supply monitor 35 and an input of engine speed control equipment indicated as block 42. The speed control equipment 42 is connected to engine 5 by a signal path as indicated as 44. A signal from a sensor (not expressly shown) which detects the speed of a component, such as a compressor rotor (not shown), of engine 5 travels along the path indicated as 46 and is connected to an input 46A of the power supply monitor 35. Conduit 48, which is interrupted by switch 49, is connected between another input 48A of the power supply monitor 35 and ground.

The operation of the apparatus schematically depicted in FIG. 1 is explained as follows. Mechanical energy provided by engine 5 is transmitted to generator 14 and therein converted into electrical power. Coarse power supply 17 converts this power to a more controlled and regulated form and makes it available to conduits 22A and 22B. Finely regulated power supply 23 receives this power and further controls and regulates it and supplies it to conduits 24A and 24B in a more highly regulated form such that the voltage at which it is delivered to conduits 24A and 24B is subject to very fine regulation such as +15 volts plus or minus 0.025 volt and −15 volts plus or minus 0.025 volt, respectively, as stated above. The finely regulated voltage signal supplied to conduit 24B is also fed to the power supply monitor 35 as a voltage signal by conduit 34. The power supply monitor 35 receives operating power from conduit 22A by means of conduit 37. This power is used to energize the monitor 35 and also to generate a reference voltage signal. The generation of the reference voltgage signal is discussed in greater detail below.

Generally, in the present invention this reference voltage signal is compared with the finely regulated signal present on conduit 24B. If the comparison indicates that the voltage present on conduit 24B exceeds acceptable limits, a fault signal is produced on conduit 40 which prompts the engine speed control equipment 42 to take measures to prevent engine acceleration as, for example, by reducing or terminating the engine fuel supply.

The engine speed signal present on conduit 46 activates the monitor 35 so that during the startup mode of engine 5, the power supply monitor 35 is turned off. Only after the engine speed passes out of the startup cycle is the power supply monitor 35 activated. The details of this operation are given below. Conduit 48 is interrupted by a switch 49, the closing of which allows an operator to simulate a signal indicating that the voltage at conduit 24B is impermissibly low, thus allowing the response of the system to be tested.

Finely regulated power supply 23, as stated above, is a tracking power supply. By this is meant that the voltage of conduit 24B will follow, or track, that of conduit 24A in magnitude, but will be opposite in sign, and, further, that the voltage of conduit 24A is independent of that of conduit 24B. For example, the voltage of conduit 24A may change from +15 to +12 volts. Conduit 24B will follow with a change of −15 to −12 volts. However, a change in voltage of conduit 24B, due to, for example, excessive current being supplied by that conduit, will not affect the voltage of conduit 24A.

Since a change in the voltage of conduit 24B is sufficient to trigger the issuance of a fault signal in the manner described above, it can be seen that the power supply monitor 35 can detect three possible malfunctions in the voltages present on conduits 24A and 24B. One, a malfunction indicated by voltage drop on conduit 24A can be detected by the accompanying voltage change generated on conduit 24B by the tracking nature of the finely regulated power supply 23. For example, a drop in voltage from −15 to +13 on conduit 24A will be accompanied by a change in voltage from −15 to −13 on conduit 24B. Thus, if the power supply monitor is set so that such a two-volt change will trigger the issuance of a fault signal, a change from +15 to +13 on conduit 24A will provide such a fault signal. Two, a change in the voltage of conduit 24B from, for example, −15 to −12 volts, which is unaccompanied by a change in voltage on conduit 24A, will be detected by the monitor and a fault signal will be provided. Three, a short circuit across conduits 24A and 24B, which would have the effect of bringing them to an identical voltage potential, would similarly be discovered, except in the unlikely event that this potential was lower than the triggering potential (discussed later) of the power supply monitor 35.

Figure 2:
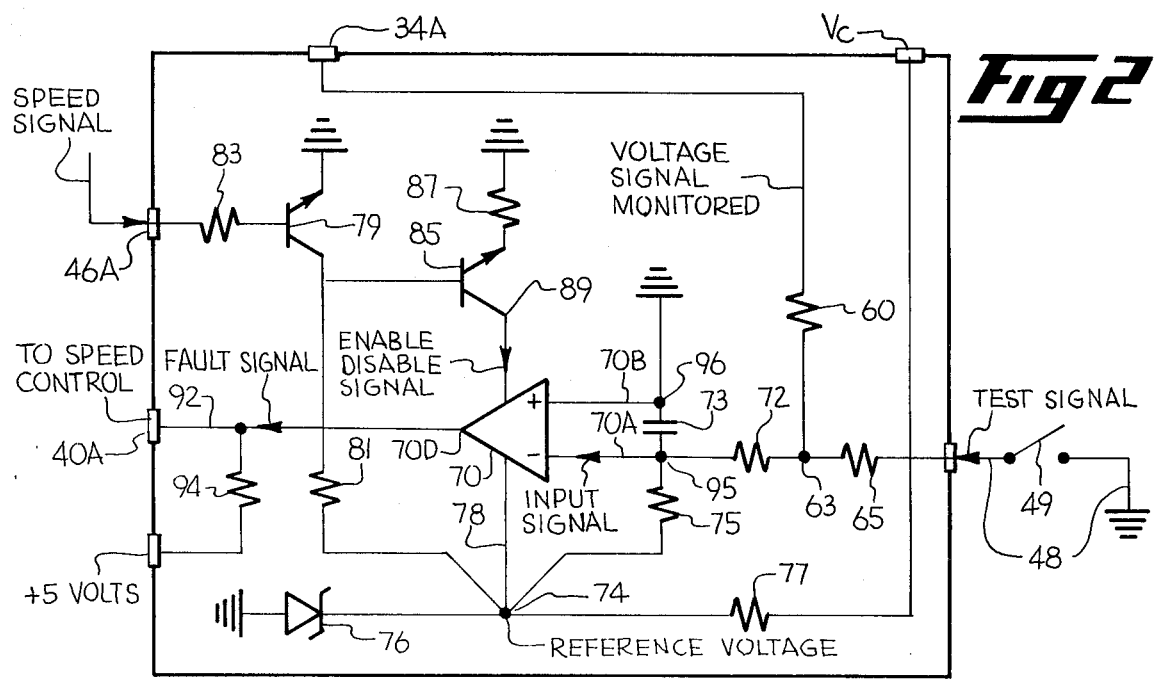
FIG. 2 depicts a schematic representation of the block labeled Power Supply Monitor shown in FIG. 1.

A more detailed description of the power supply monitor 35 in FIG. 1 is given in FIG. 2. The voltage to be monitored is that present on terminal 34A which corresponds to conduit 34 in FIG. 1. Resistor 60 is connected between conduit 34 and node 63. Node 63 is connected to one terminal of switch 49 by means of resistor 65. The other terminal of switch 49 is connected to ground. Node 63 is also connected to the inverting input 70A of a comparator 70 by means of resistor 72. The noninverting input 70B of comparator 70 is connected to a reference potential such as ground. A capacitor 73 is connected between the two inputs 70A and 70B of comparator 70. The inverting input 70A of comparator 70 is also connected to a node 74 by means of a resistor 75. Node 74 is connected to ground by means of a p-n junction device, such as a Zener diode 76, as well as to a coarsely regulated voltage designated $V_c$. The coarsely regulated voltage $V_c$ corresponds to that present on conduit 22A in FIG. 1 and is connected to node 74 by means of resistor 77. Node 74 is further connected to a power input 78 of comparator 70. Node 74 is also connected to the collector of NPN transistor 79 by means of resistor 81. The emitter of transistor 79 is connected to ground and the base of this transistor is connected to a conduit 46A. Conduit 46A corresponds to signal path 46 in FIG. 1 and is connected to the base of transistor 79 by means of resistor 83. The collector of transistor 79 is connected to the base of transistor 85, the emitter of which is connected to ground by means of resistor 87. The collector of transistor 85 is connected to an enabling input 89 of comparator 70.

The output 70D of comparator 70 is connected to conduit 92 which is connected to a 5-volt positive power supply, e.g., +5 volts, by means of resistor 94 as well as to a terminal 40A corresponding to conduit 40 in FIG. 1. This terminal is further connected to engine speed control equipment 42 (not shown in FIG. 2), indicated schematically in FIG. 1.

The operation of the above-described circuitry is explained as follows. The voltage supplied to terminal $V_c$ causes a current to flow throuch resistor 77, through Zener diode 76 and to ground. As is well known, a Zener diode provides a voltage clamping function so that as the current increases through the Zener diode from zero to some value, the voltage drop across the Zener diode likewise increases. However, once the voltage drop reaches a certain magnitude determined by the characteristics of the Zener diode, no further Zener voltage increase will follow, despite further current increases. Thus, if a sufficiently large current is induced to flow through Zener diode 76, the voltage at node 74 is be clamped at a certain ceiling and will become no greater. Accordingly, a predetermined first voltage reference is established at node 74.

Between node 74 and the conductor presenting the voltage to be monitored, namely, terminal 34A, are connected resistors 60, 72, and 75. These resistors function as a voltage divider network. Knowledge of their values, the value of the voltage at node 74, and the value of the voltage to be monitored, namely that at terminal 34A, will allow the input voltage signal applied to the inverting input of comparator 70 to be calculated. In a preferred embodiment, the voltage applied to this inverting input will be slightly below ground potential when the voltage of the monitored terminal 34A is correct. A second reference voltage signal, such as ground potential, is applied to the noninverting input of comparator 70.

Let it be assumed that switch 49 remains open and transistor 85 is not connected to comparator 70. In this case, comparator 70 functions to compare the voltages present at its two inputs 70A and 70B. If the voltage on the inverting input 70A is less than that applied to the noninverting input 70B the voltage at the comparator's output will be one in binary logic terms, e.g., +5 volts.

Should the voltage at inverting input 70A creep slightly in the positive direction, as, for example, due to a positive creep in the voltage at terminal 34A, then at the time when the voltage at inverting input 70A crosses zero volts, that is, just as it passes ground potential going in the positive direction, comparator 70 will be triggered. A fault signal will appear at the output node of comparator 70 in that comparator 70 pulls its ouput voltage to a state of "Zero" in binary logic terms, e.g., to zero volts. Thus, a deviation in the monitored voltage present at conduit 34 is detected and a fault signal in the form of a swing in the voltage at conduit 92 is generated. This fault signal is utilized as an engine speed control signal in a manner later to be described.

Capacitor 73 operates to filter out voltage transients resulting from such sources as unavoidable electrical noise present in the environment. It accomplishes this function due to the fact that capacitor 73 requires a finite time to charge or discharge, that is, a finite time to change its voltage. If the duration of the transient is shorter than this finite time, the transient will disappear before the voltage across capacitor 75 (which is the same as the voltage across the input terminals of comparator) can appreciably change. Thus, comparator 70 will be relatively unaffected by the transient.

The degree of sensitivity of comparator 70 to changes in the monitored voltage at conduit 34A is determined partly by the voltage present at node 95 which is in turn determined by combination of the following: the voltage at conduit 34A; the values of the three resistors 60, 72, and 75; and the voltage at terminal $V_c$. The closer the voltage of node 95 is set to that of node 96 by manipulation of these five parameters, the smaller a change in voltage of node 95 is needed to trigger comparator 70, and the more sensitive will be the system to small variations in the voltage at terminal 34A. Conversely, the more negative node 95 is set to be with respect to node 96, the less sensitive will the system be.

Conduit 46A carries a signal indicative of engine speed as stated above. When the engine speed exceeds a certain value, indicating that the engine has passed out of its startup range, a signal present on conduit 46A and designated "speed signal" becomes one in binary logic terms. This has the effect of increasing the current conducted by transistor 79, thereby lowering the voltage between its collector and ground, thereby lowering the voltage applied to the base of transistor 85, thus turning off transistor 85. This action has the effect of allowing the collector voltage of transistor 85 to rise. This activates the enabling input 89 of comparator 70 and activates comparator 70. Thus, when the engine speed is too low, comparator 70 is turned off, and when the engine speed passes out of the startup range, comparator 70 is activated.

When switch 49 is closed, node 63 is connected to ground through resistor 65. Since a resistor divider network is thus established between conduit 34A, ground, and node 74, including resistors 60, 65, 72, and 75, the voltage of node 63 will rise if the proper value of these resistors have been selected. If the rise is sufficient, the voltage of node 95 will exceed that of node 96, comparator 70 will be triggered and a fault signal will appear at node 92. Thus, switch 49 allows an operator to test the operation of the voltage supply monitor by manually triggering comparator 70.

The fault signal present on the node 92 is fed to engine speed control equipment 42 in FIG. 1. This equipment 42 responds to the fault signal by adjusting engine controls so as to prevent engine acceleration. One example of such adjustment is the reduction or termination of fuel supplied to the engine. This functions to reduce engine speed and thus to prevent any changes in the voltages supplied by the finely regulated power supply from inducing indirectly an acceleration in the speed of the engine.

Accordingly, a power supply monitor has been disclosed which monitors a voltage signal supplied by a finely regulated stage in a power supply. The monitor receives its own power from a different source than the stage which is monitored. The monitor further takes action to prevent acceleration of an engine which drives a generator which powers the power supply, should a deviation in the monitored voltage signal occur. The monitor remains inactive during the startup phase of this engine and the monitor provides for manual testing by an operator.

While a preferred embodiments of the present invention has been disclosed, it is to be understood that numerous changes can be made without departing from the true spirit and scope of the present invention. Accordingly, it is contemplated that the present invention be limited only by the spirit and scope of the appended claims.

I claim:

1. A system for detecting variation in a relatively finely regulated voltage signal which is generated by a relatively finely regulated power supply which is powered by a relatively coarsely regulated power supply, said system comprising:
   (a) means for generating a first reference voltage signal;
   (b) means for generating an input signal which is dependent upon both the first reference voltage signal and the finely regulated voltage signal;
   (c) comparison means to compare the input signal with a second reference signal and to generate an output signal when the difference between the input signal and the second reference signal reaches a predetermined value.

2. In a tracking electric power supply adopted to be driven by a gas turbine engine and having a coarsely regulated power supply stage powering a finely regulated power supply stage, a system for controlling speed regulating equipment of said engine comprising:
   (a) means for generating a reference signal;
   (b) comparison means for comparing said reference signal with an output signal of said finely regulated power supply stage and for generating a fault signal in response when the difference therebetween reaches a predetermined value; and
   (c) means for coupling said fault signal to said speed regulating equipment.

3. A system in accordance with claim 1 or 2 and further comprising means to activate said comparison means only when the speed of said engine exceeds a predetermined value.

4. System in accordance with claim 1 or 2 in which the means for generating the first reference voltage comprises a p-n junction device.

5. System in accordance with claim 4 in which said p-n junction device comprises a Zener diode.

6. System in accordance with claim 1 and further comprising filter means coupled to the comparison means for filtering out transient signals from said input signal.

7. System in accordance with claim 6 in which said filter means comprises a capacitor connected across the input terminals of said comparison means.

8. System in accordance with claim 1 or 2 which further comprises means for providing substantially all power required by said system for said coarsely regulated power supply stage.

9. System in accordance with claim 1 or 2 and further comprising testing means effective to selectively trigger said comparison means.

10. In a tracking electric power supply driven by a gas turbine engine and having a coarsely regulated power supply stage powering a finely regulated power supply stage, a system for controlling speed regulating equipment of said engine comprising:
    (a) sensing means for generating a speed signal indicative of the speed of a component in said engine;
    (b) means to generate a first reference voltage signal;
    (c) means to combine an output signal of said finely regulated power supply with said first reference voltage signal to thereby produce an input signal;
    (d) comparison means effective to produce a fault signal when the difference between said input signal and a second predetermined reference voltage signal reaches a predetermined threshold;
    (e) means for coupling said fault signal to said speed regulating equipment to prompt said equipment to prevent engine overspeed;
    (f) means to activate said comparison means only when said speed signal indicates that said engine component speed is above a predetermined value; and
    (g) testing means to selectively trigger said comparison means into producing said fault signal.

11. A method of protecting against voltage variations in a tracking power suply having coarsely and finely regulated stages and driven by a gas turbine engine comprising the steps of:
    (a) utilizing power drawn from the coarsely regulated stage to establish a first reference voltage signal and to energize a comparator
    (b) turning the comparator off and on when the speed of the engine falls respectively below and above a predetermined limit
    (c) comparing a voltage signal derived from the first reference voltage signal with a second reference voltage signal and generating a fault signal if the difference between the two exceeds a predetermined magnitude
    (d) modifying an engine performance parameter in response to the fault signal.

* * * * *

UNITED STATES PATENT AND TRADEMARK OFFICE
CERTIFICATE OF CORRECTION

PATENT NO. : 4,463,267
DATED : July 31, 1984
INVENTOR(S) : William G. Bools

It is certified that error appears in the above-identified patent and that said Letters Patent is hereby corrected as shown below:

Column 1, delete first paragraph (lines 1, 2, 3) and insert therefor:

-- The U.S. Government has rights in this invention pursuant to Navy Contract No. N00019-81-C-0192 awarded by the Department of the Navy. --

Column 5, line 39, change "throuch" to --through--.

Column 8, line 17 (claim 8), change "for" to --from--.

Column 8, line 47 (claim 11), change "suply" to --supply--.

Signed and Sealed this

Sixth Day of August 1985

[SEAL]

*Attest:*

DONALD J. QUIGG

*Attesting Officer*     *Acting Commissioner of Patents and Trademarks*